United States Patent [19]

Usami

[11] Patent Number: 5,478,195
[45] Date of Patent: Dec. 26, 1995

[54] PROCESS AND APPARATUS FOR TRANSFERRING AN OBJECT AND FOR PROCESSING SEMICONDUCTOR WAFERS

[75] Inventor: Yasutsugu Usami, Katsuta, Japan

[73] Assignee: Hitachi, Ltd., Tokyo, Japan

[21] Appl. No.: 985,200

[22] Filed: Dec. 3, 1992

[30] Foreign Application Priority Data

Dec. 20, 1991 [JP] Japan ................... 3-337341

[51] Int. Cl.$^6$ ............................... B65G 49/05
[52] U.S. Cl. ................ 414/786; 414/217; 414/937; 414/939
[58] Field of Search .................. 414/217, 222, 414/331, 416, 786, 937, 939, 940; 204/298.25, 298.35

[56] References Cited

U.S. PATENT DOCUMENTS

| | | | |
|---|---|---|---|
| 4,643,629 | 2/1987 | Takahashi et al. | 414/331 |
| 4,654,106 | 3/1987 | Davis et al. | 204/298.35 X |
| 4,695,215 | 9/1987 | Jacoby et al. | 414/331 X |
| 4,715,921 | 12/1987 | Maher et al. | 204/298.35 X |
| 4,778,382 | 10/1988 | Sakahashi | 414/937 X |
| 4,836,733 | 6/1989 | Hertel et al. | |
| 4,995,063 | 2/1991 | Enoki et al. | 414/937 X |
| 5,030,056 | 7/1991 | Kitayama et al. | 414/331 X |
| 5,076,205 | 12/1991 | Vowles et al. | 414/416 X |
| 5,186,594 | 2/1993 | Toshima et al. | 414/222 X |
| 5,254,170 | 10/1993 | Devilbiss et al. | 414/937 X |

FOREIGN PATENT DOCUMENTS

| | | |
|---|---|---|
| 0272141 | 12/1987 | European Pat. Off. . |
| 54-144866 | 12/1979 | Japan . |
| 63-72137 | 4/1988 | Japan ................ 414/937 |
| 3181441 | 7/1988 | Japan ................ 414/937 |
| 239523 | 2/1990 | Japan . |
| 3248443 | 11/1991 | Japan ................ 414/940 |
| 4154144 | 5/1992 | Japan ................ 414/937 |
| 4157752 | 5/1992 | Japan ................ 414/940 |
| 2193482 | 4/1987 | United Kingdom . |
| 2193731 | 2/1988 | United Kingdom . |
| WO8706561 | 11/1987 | WIPO . |

*Primary Examiner*—Michael S. Huppert
*Assistant Examiner*—Stephan Gordon
*Attorney, Agent, or Firm*—Evenson McKeown Edwards & Lenahan

[57] ABSTRACT

Apparatus for processing semiconductor wafers includes a load lock chamber with a first gate valve and a second gate valve so as to load and unload cassettes through the first gate valve, and to convey the wafers from the load lock chamber to a plurality of processing chambers through respective second valves. The load lock chamber is provided with a turntable which holds the plurality of cassettes. The turntable conveys each of the cassettes in front of respective ones of the second valves.

6 Claims, 3 Drawing Sheets

PROCESS AND APPARATUS FOR TRANSFERRING AN OBJECT AND FOR PROCESSING SEMICONDUCTOR WAFERS

BACKGROUND AND SUMMARY OF THE INVENTION

The present invention relates to a process and apparatus for processing and transferring an object, such as a semiconductor wafer.

Semiconductor processing equipment, such as ion-implantation equipment, sputtering equipment, etching equipment and the like, carries out a plurality of processing steps sequentially in a vacuum environment. In such equipment, it has been suggested to provide a vacuum chamber for loading semiconductor wafers to be processed. To improve process throughput, a loadlock mechanism with a gate valve is provided for separating a vacuum processing chamber from a chamber in which loading and unloading of wafer-holding cassettes are carried out.

Japanese Patent Publication No. 54-144866 (1979) describes a continuous conveyor mechanism which controls the operation of a gate valve in conveying wafer-holding cassettes into a vacuum processing chamber for sequential processing. According to this arrangement, in order to provide for a sequential processing of the cassettes by the continuous conveyor mechanism, a front and back loadlock chamber is provided at the respective front and back of the vacuum processing chamber. Further, gate valves are required at least at four locations for partitioning respective chambers in the system. Also, each of the respective chambers requires individual exhaust systems and associated complex vacuum valves and complex control mechanisms.

U.S. Pat. No. 4,836,733 discloses an arrangement for providing for a plurality of loadlock chambers for a plurality of cassettes. Semiconductor wafers are conveyed to and between respective loadlock chambers and a vacuum processing chamber. Since each loadlock chamber requires individual exhaust systems, however, an evacuation operation is required each time a cassette is placed in a respective loadlock chamber. A long process time is therefore needed for carrying out the large number of evacuation operations. This arrangement also involves a problem in that the number of exhaust systems increases the required number of machine components, with consequent lower system reliability.

Japanese Patent Publication No. 2-39523 (1990) discloses an arrangement in which three vacuum processing chambers, disposed approximately 90 degrees apart from one another, are disposed concentrically around a vacuum loadlock chamber connected thereto via respective gate valves. Wafers loaded in the vacuum loadlock chamber will be conveyed from there through the respective gate valves into a selected one of the three vacuum processing chambers. In this arrangement, it is possible for a particular wafer in the vacuum loadlock chamber to be conveyed into one of the three vacuum processing chambers disposed concentrically around the periphery thereof to be subjected to a relevant vacuum processing step. The problem is, however, that the efficiency of the system is poor because, while one wafer is being processed in a particular chamber, the remaining vacuum processing chambers are unused.

In arrangements which include conveyance systems, such as rotatable tables which carry the semiconductor wafers from one station to another, the speed at which the rotatable conveyor table can be rotated during use is limited due to the centrifugal force acting on the wafers. With high rotational velocities, the centrifugal forces can cause the semiconductor wafers to move relative to the table surface, and therefore not be precisely positioned for the next operational step. This problem of the object shifting on the turntable can be especially troublesome when the surface of the wafer or other object being carried is very smoothly finished so that the starting and sliding friction coefficient between the table surface and the object is very low.

An object of the present invention is to provide an improved semiconductor wafer processing system which includes multiple processing steps carried out in different vacuum chambers.

It is another object of the present invention to provide an object conveying system for conveying objects between work stations, while subjecting them to centrifugal force, in such a manner that the objects are not displaced relative to the conveying member due to the centrifugal forces. This object improves the speed of operation of the system by permitting more rapid conveying steps, while counteracting the centrifugal force effects in a simple and economical manner.

Certain of the above-noted and other objects of the present invention are achieved according to certain preferred embodiments of the invention by providing apparatus which includes: a plurality of vacuum processing chambers for processing the semiconductor wafers, a loadlock chamber which is evacuated by a vacuum pump, a first gate valve coupled to said loadlock chamber for loading and unloading cassettes which contains the semiconductor wafers therethrough, a plurality of second gate valves coupled to the respective loadlock chamber for shifting the semiconductor wafers from the loadlock chamber to the vacuum processing chambers therethrough, and a cassette carrier which holds the plurality of cassettes in the loadlock chamber so as to move the cassettes in front of the second gate valves.

Additional objects of the present invention are also achieved by providing a method of processing semiconductor wafers which includes the steps of: (a) conveying a plurality of cassettes which contain the semiconductor wafers to a loadlock chamber evacuated by a vacuum pump, through a first gate valve, (b) holding said a plurality of cassettes on a cassette carrier in the loadlock chamber, (c) shifting the cassettes in front of one of a plurality of second gate valves which are connected respectively to a plurality of vacuum processing chambers and (d) conveying the semiconductor wafers from the loadlock chamber to the vacuum processing chambers.

The apparatus and method of the present invention referred to above provide for an increase in the number of semiconductor wafers which can be vacuum processed for single vacuum pumping of the loadlock chamber. Further, the invention makes it possible to provide a loadlock chamber for semiconductor processing equipment which can process a plurality of wafers in vacuum continuously and automatically, featuring advantages such as a high throughput, space-saving construction, stable operation and economical manufacturing cost.

The foregoing objects with respect to counteracting centrifugal force effects so as to increase conveying speeds when using a turntable or the like which inherently imparts centrifugal forces to the object being rotated is achieved in a very simple manner by providing apparatus which includes a tilting device for tilting the conveyor surface carrying the object during movement of the conveyor surface and a control system for controlling the tilting device so as to return the conveyor surface to a desired untilted orientation when the conveying motion is stopped with the object adjacent to the next processing station. This object is also achieved by providing a method of applying the tilting movement to the conveyor surface during centrifugal force and parting movements and then applying forces to the conveyor surface to return it to a non-tilted position to accommodate the next processing or transfer to the next processing station.

The tilting arrangement for the conveyor surface to counteract the centrifugal forces on the object being conveyed is especially advantageous in currently preferred embodiments of the present invention where the system is used in conjunction with the above-described apparatus and process for processing semiconductor wafers under vacuum conditions. By placing the plurality of cassettes on a rotatable turntable at different angular positions around the table, and then applying tilting movement to the cassettes so as to counteract centrifugal forces during rapid rotation of the table between work stations, the throughput of the semiconductor wafer processing equipment is improved in a reliable and simply manner.

Other objects, advantages and novel features of the present invention will become apparent from the following detailed description of the invention when considered in conjunction with the accompanying drawings.

DETAILED DESCRIPTION OF THE DRAWINGS

Figure 1:
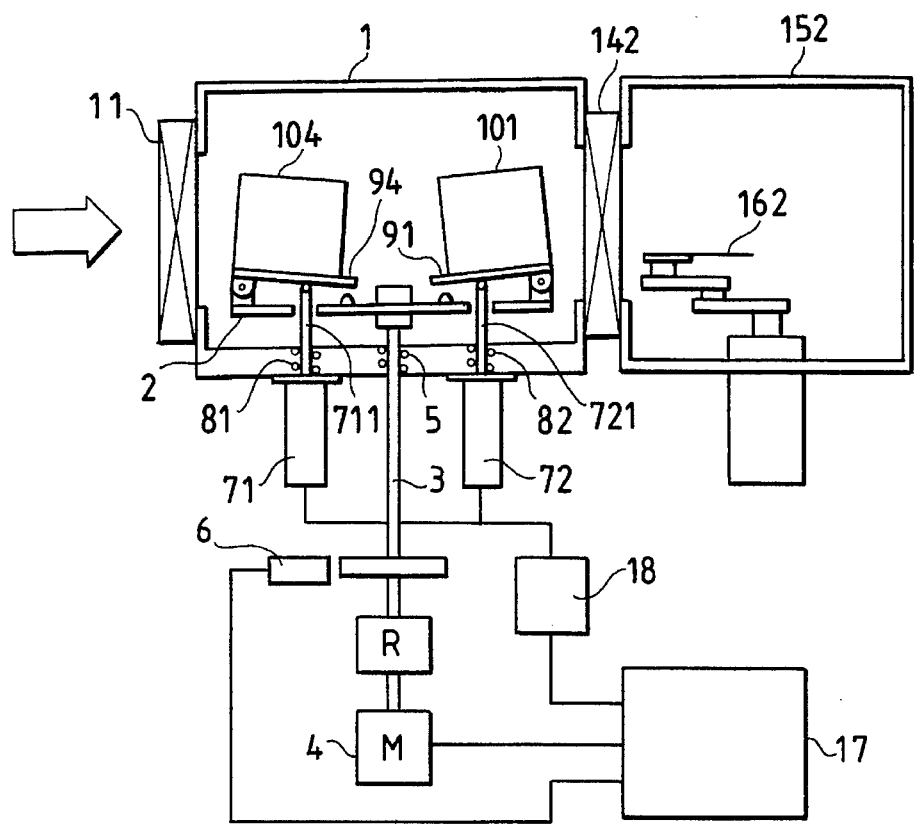
FIG. 1 is a schematic front cross-sectional view of a load-lock chamber of one embodiment of the invention.
Figure 2:
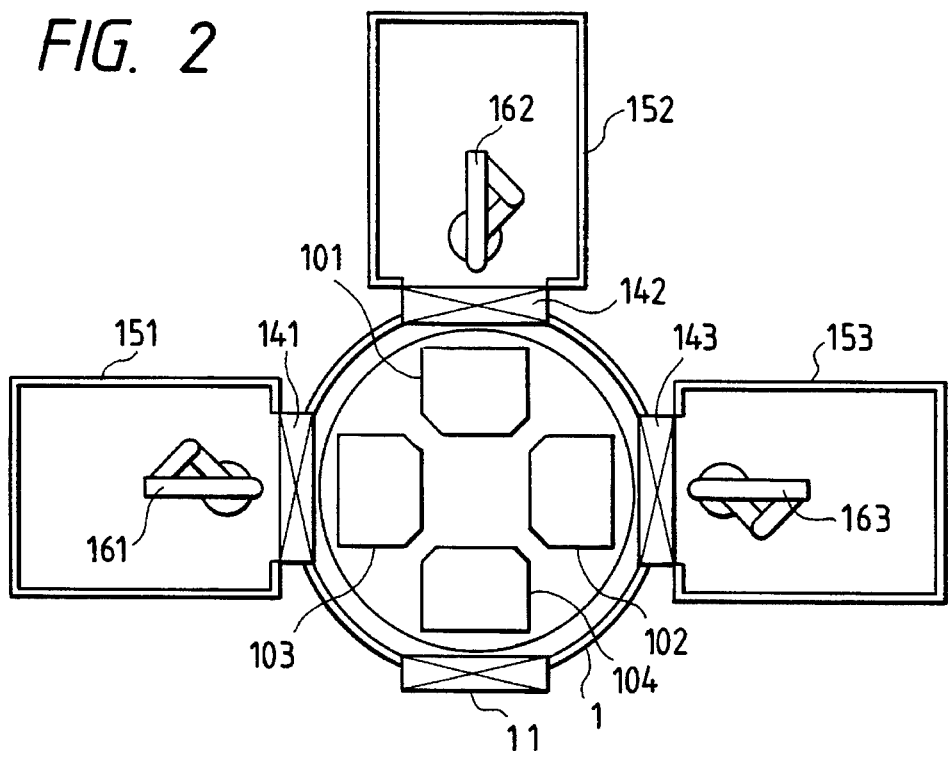
FIG. 2 is a schematic top cross-sectional view of the load-lock chamber shown in FIG. 1.

With reference to FIGS. 1 and 2, a plurality of cassettes 101 through 104 are loaded into a load lock chamber 1 from outside through a gate valve 11 so as to be mounted on a turntable 2 in the load lock chamber. Then, the gate valve 11 is closed air-tight to start the evacuating the entire load lock chamber 1, and thereafter a turntable 2 is rotated to transfer a specified cassette to the position of a specified gate valve associated with a specified vacuum processing chamber, and the gate valve 11 is opened to allow the cassette to be conveyed into the processing chamber.

For example, when a wafer contained in a cassette 102 is to be processed in a processing chamber 153, turntable 2 is rotated so as to position the cassette 102 in front of a gate valve 143, then the gate valve 143 is opened, thereby permitting a conveyor robot 163 to selectively remove a specified wafer out of the cassette 102 for conveyance into the processing chamber 153.

Corresponding conveyor robots 161 and 162 are provided at the gate valves 141 and 142.

In such arrangements for the gate valve and cassettes where gate valves 141 through 143 are disposed around the periphery of the load lock chamber spaced at regular angular intervals, and cassettes 101 through 104 are also mounted at the same angular intervals on the turntable, when one of the cassettes is transferred in front of a specified processing chamber, the other cassettes are also transferred simultaneously in front of the other corresponding gate valves, respectively. This facilitates simultaneous conveyance of wafers in each cassette into each corresponding processing chamber by a conveyance robot provided in each processing chamber. That is, in a single rotation of the turntable 1, wafers stored in the cassettes 101 through 104 are capable of being conveyed into corresponding processing chambers 151 through 153 individually and simultaneously for respective, pertinent vacuum processing.

Further, even though a particular cassette has been transferred in front of a specified processing chamber, when any one of the other cassettes fails to be positioned in front of a corresponding processing chamber, a next turn of the turntable 2 should provide conveyance of the cassette to the specified processing chamber to be loaded therein by the conveyor robot installed therein.

Through operations hereinabove described, a single cycle of evacuation of the load lock chamber is capable of providing for a simultaneous or continuous vacuum processing of a plurality of wafers, thus improving the system throughput significantly. Additionally, cassettes 101 through 104 are capable of holding, e.g., twenty-five sheets of 8" wafers, respectively.

If the turntable 2 is scaled up (i.e. made larger), the number of cassettes conveyable on the turntable 2 will increase, with the dimensions of load lock chamber 1 also being increased accordingly. Thus, the number of processing chambers connected to the periphery thereof can be increased, thereby further increasing the number of wafers which can be treated and varieties of processing affordable in a single vacuum pumping of the load lock chamber.

With reference to FIG. 1, turntable 2 is driven by a rotation axle 3 connected thereto, via hermetic sealing O-rings and a magnetically sealed axle, and to a drive system 4, M, R provided in outside atmosphere for actuating the rotation axle 3 supported in bearing 5. A control unit 17 is responsive to rotational position signals from a position detector 6 utilizing an encoder attached to rotational axle 3 or a slit apparatus for detection and controls the rotational position of turntable 2 so as to move each cassette to a specified position carried on the turntable 2.

On the turntable 2, there are provided cassette tables 91 through 94, each for holding a cassette thereon. Each of the cassette tables 91 through 94 is linked at one side as shown in FIG. 1 to the peripheral portion of turntable 2 through a hinge connection so as to allow the tilt angle thereof to be varied.

When the turntable 2 stops at a designated position, the tip ends of rods 711, 721 connected to respective air cylinders (drive systems) 71 through 74 provided at the bottom of the load lock chamber 1, are caused to elevate through small holes provided in the rotary table 2 to lift the cassette tables 91 through 94 to be maintained approximately at a level position. Additionally, the rods 711, 721, 731, 741 are inserted into the load lock chamber via respective hermetic sealing O-rings 81 through 84.

The control unit 17 actuates respective air cylinders 71 through 74 via a conventional electromagnetic valve 18 so as to control tilting of respective cassette tables 91 through 94.

Under such conditions that the cassette tables 91 through 94 are maintained at a level position, loading and unloading of cassettes through the gate valve 11, or gate valves 141 through 143 are carried out. After the loading and unloading of the above cassettes have been completed, air cylinders 71 through 74 actuate the rods 711, 721, 731, 741 to lower the rods below the turntable 2 and make the turntable 2 ready to rotate. At this time, the respective cassette tables 91 through 94 are caused to be inclined with their one sides lowered toward the center of the rotary table 2.

Further, to prevent each cassette from slipping off the cassette table when it is inclined as described above toward the center of the rotary table 2, there is provided a stopper on each one of the cassette tables 91 through 94. After the loading of cassettes through the gate valve 11 has been completed, the gate valve 11 is hermetically closed to permit the start of vacuum pumping of the entire load lock chamber. Then, the turntable 2 is rotated so as to transfer a particular cassette to the position of a specified gate valve connected to a specified vacuum processing chamber.

During rotation of the above turntable 2, a centrifugal force is exerted upon the wafers in cassettes 101 through 104. Each wafer is, however, prevented from being ejected because each cassette is tilted in a manner as described above. Then, while all the cassette tables are maintained at a level position, respective corresponding gate valves are opened to allow their vacuum robots to convey specified wafers from specified cassettes into respective specified processing chambers.

After a processing operation on specified wafers has been completed in the related processing chambers, the loading and unloading gate valves are opened again to allow the vacuum robots to return the wafers to specified wafer cassettes to make them ready to advance to a next step of processing.

For unloading the above wafers, it is also possible to stop a cassette table as tilted and allow a vacuum robot to unload a specified wafer from a tilted cassette on the tilted cassette table. Moreover, when loading wafers through the gate valve 11 into the load lock chamber 1, it is also possible to stop the cassette table as tilted and mount a cassette on a specified cassette table for conveyance.

An important aspect of the present invention is that a number of wafer-holding cassettes have been installed in a load lock chamber so as to enable a plurality of wafers therein to be conveyed simultaneously into a plurality of corresponding processing chambers for simultaneous processing, thus improving the throughput significantly. With reference to FIGS. 1 and 2, the load lock chamber includes a turntable 2 on which a plurality of cassette tables 91 through 94 can be mounted, so that when the turntable 2 is rotated, a specified wafer case is positioned in front of a specified processing chamber.

However, because the surfaces of a wafer are very smoothly finished, there arises a problem that the wafer is readily caused to be ejected out of a wafer case of known construction due to centrifugal force when the above turntable is rotated. According to the present invention, the air cylinders 71 through 74 extend, through the small holes provided in the turntable, to the cassette tables 91 through and 94 and cause their tilting to counteract the centrifugal force.

Figure 3:
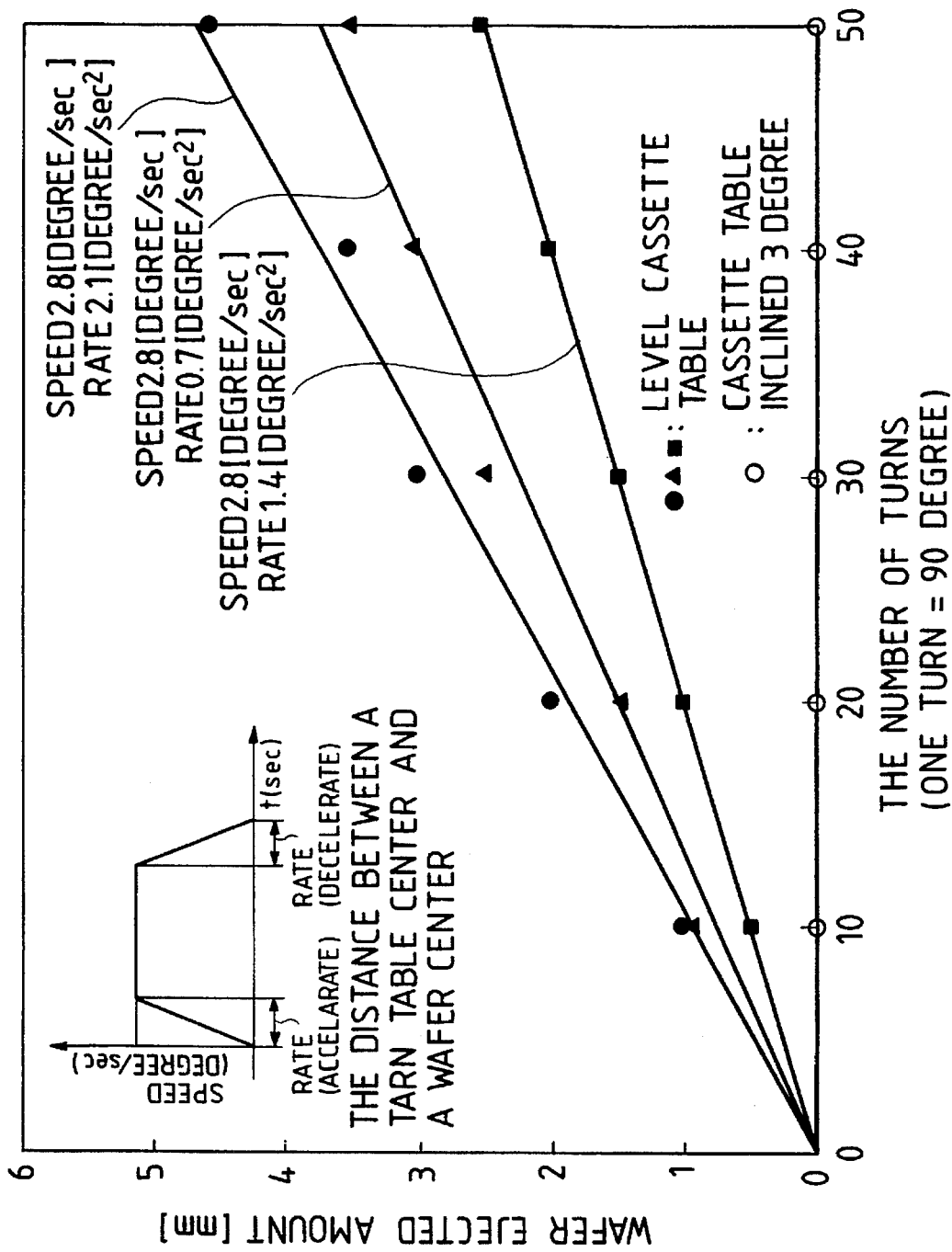
FIG. 3 is a graph showing the quantities of wafer ejection measured in terms of displacement.

FIG. 3 is a graph showing the measured data indicative of a relationship between a tilting of the cassette tables and their resultant quantity of ejection measured in terms of displacement of a wafer, under varied conditions. A wafer under rotation is subjected to a centrifugal force, $F_1=mr\omega^2$, where m is a mass of a wafer, r is a distance between the center of the turntable 2 and the center of gravity of the wafer (in FIG. 3, r=210 cm), and $\omega$ is an angular velocity of rotation. When the wafer is inclined inwardly to the center of rotation by angle $\Theta$, however, a frictional force represented by $F_2 2=mr\omega^2\sin\Theta$ acts on the wafer to counteract the above-described force $F_1$.

As shown in FIG. 3, when the cassette tables are kept at a level position, the quantities of displacement of wafers in the cassettes increase in response to increasing rotational speeds and angular velocities as indicated by plotted lines drawn along solid circles, solid triangles and solid squares. In contrast, tilting of the cassette tables 91 through 94 approximately by a three degree (3°) angle results in a line plotted along circles (coincident with the horizontal axis) causing no ejection or displacement of wafers as above observed.

Figure 4:
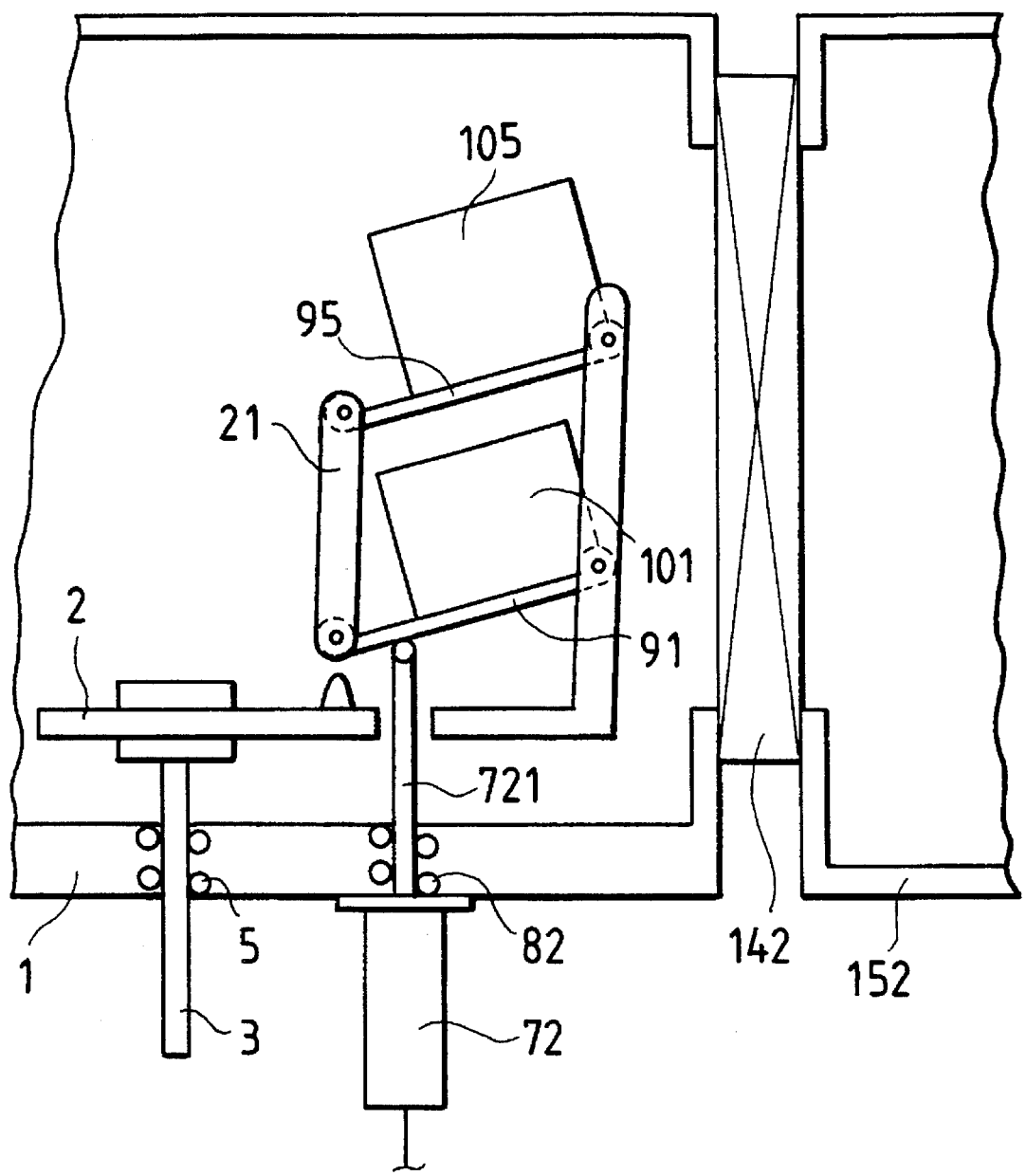
FIG. 4 is a cross-sectional view showing a part of a load-lock chamber of another embodiment of the invention.

FIG. 4 shows another embodiment of the invention wherein an increased number of cassette installations has become possible. A turntable 2 holds a plurality of cassettes stacked in a double-deck arrangement such that the number of wafers to be vacuum processed per single vacuum pumping of a load lock chamber 1 can be doubled, thereby further improving the system throughput. More specifically, a turntable 2 is provided with a cassette table 91 hinged with another cassette table 95, so as to permit an increased number of cassettes 105 to be mounted thereupon. One end of the cassette tables 91 and 95 is linked with a connecting rod 21 to permit the cassette table 95 also to be lifted in an interlocking mode when the cassette table 91 is pushed upward by a rod 721 and an air cylinder 72 in essentially the same manner as described above with respect to in FIG. 1.

Although the invention has been described and illustrated in detail, it is to be clearly understood that the same is by way of illustration and example, and is not to be taken by way of limitation. The spirit and scope of the present invention are to be limited only by the terms of the appended claims.

I claim:

1. A method of processing semi-conductor wafers in a processing system which includes a load lock chamber with a first gate valve for accommodating transfer of cassettes containing multiple wafers to and from the load lock chamber and a plurality of vacuum processing chambers connected by respective second gate valves to the load lock chamber, which second gate valves accommodate transfer of individual wafers between respective ones of the cassettes in the load lock chamber and respective ones of the vacuum processing chambers, said method comprising the sequential steps of:

transferring a first wafer from a first one of said cassettes to a first one of said vacuum processing chambers through a first one of said second gate valves;

initiating vacuum processing of said first wafer in said first vacuum processing chamber, moving the first cassette to a position adjacent a second one of said vacuum processing chambers, transferring a second wafer from the first cassette to the second vacuum processing chamber through a second one of said second gate valves, and initiating vacuum processing of said second wafer in the second vacuum chamber while continuing to vacuum process the first wafer in said first vacuum chamber.

2. A method according to claim 1, comprising the additional steps of:

transferring a plurality of cassettes which each contain a plurality of semi-conductor wafers through the first gate valve to respective spaced apart cassette supporting sections on a movable cassette carrier disposed in the load lock chamber, subsequentially moving the cassette carrier within the load lock chamber to position respective cassette supporting sections of the carrier at second gate valve access positions adjacent respective ones of said second gate valves.

3. A method according to claim 1, wherein said moving of the first cassette includes moving a cassette carrier disposed in the load lock chamber, said carrier including spaced apart cassette supporting sections for supporting respective cassettes, further comprising the sequential steps of returning the first and second wafers to the first cassette after moving the carrier to sequentially locate the first cassette adjacent the first and second vacuum processing chambers.

4. A method according to claim 3, further comprising the subsequent step of removing the first cassette from the load lock chamber via the first gate valve after moving the carrier to locate the first cassette adjacent the first gate valve.

5. A method according to claim 3, wherein the carrier is a rotatable turntable having said cassette supporting sections equally angularly spaced from one another around a rotating axis of the turntable, and wherein said moving of the carrier includes sequential rotation of the turntable.

6. A method according to claim 5, further comprising tilting the cassette supporting sections during rotation of the turntable to thereby counteract centrifugal forces acting on wafers in the cassettes carried by the turntable.

* * * * *